(12) United States Patent
Kim

(10) Patent No.: US 9,590,019 B2
(45) Date of Patent: Mar. 7, 2017

(54) DISPLAY APPARATUS CAPABLE OF CONTROLLING LIGHT TRANSMITTANCE

(71) Applicant: Samsung Display Co., Ltd., Yongin, Gyeonggi-Do (KR)

(72) Inventor: Sangil Kim, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 41 days.

(21) Appl. No.: 14/801,590

(22) Filed: Jul. 16, 2015

(65) Prior Publication Data

US 2016/0028044 A1 Jan. 28, 2016

(30) Foreign Application Priority Data

Jul. 22, 2014 (KR) .................. 10-2014-0092666

(51) Int. Cl.
*H01L 27/32* (2006.01)
*H01L 51/52* (2006.01)

(52) U.S. Cl.
CPC ........ *H01L 27/3232* (2013.01); *H01L 27/326* (2013.01); *H01L 51/5281* (2013.01); *H01L 2251/5323* (2013.01); *H01L 2251/5338* (2013.01)

(58) Field of Classification Search
CPC .............. H01L 27/3232; H01L 27/326; H01L 2251/5323; H01L 2251/5338; H01L 51/5281
See application file for complete search history.

(56) References Cited

U.S. PATENT DOCUMENTS

| | | | |
|---|---|---|---|
| 2003/0156077 A1 | 8/2003 | Balogh | |
| 2013/0170004 A1 | 7/2013 | Futterer | |
| 2014/0225815 A1* | 8/2014 | Jung | G09G 5/02 345/83 |

* cited by examiner

*Primary Examiner* — Kyoung Lee
(74) *Attorney, Agent, or Firm* — Innovation Counsel LLP

(57) ABSTRACT

A display apparatus capable of controlling light transmittance includes: a transparent organic light emitting device comprising a first region including an emission region capable of emitting light and a second region adjacent to the first region in a horizontal direction and including a transmission region capable of transmitting external light therethrough; and a light transmission control device coupled to and facing the transparent organic light emitting device, the light transmission control device comprising a third region formed at a location corresponding to the first region and a fourth region adjacent to the third region in the horizontal direction and positioned to correspond to the second region, wherein the fourth region comprises a sealed cavity having a transmission control material layer therein, and the transmission control material layer is configured to be selectively driven by the light transmission control device.

15 Claims, 13 Drawing Sheets

DISPLAY APPARATUS CAPABLE OF CONTROLLING LIGHT TRANSMITTANCE

RELATED APPLICATION

This application claims the benefit of Korean Patent Application No. 10-2014-0092666, filed on Jul. 22, 2014 in the Korean Intellectual Property Office, the disclosure of which is incorporated herein in its entirety by reference.

BACKGROUND

1. Field

One or more embodiments of the present invention relate generally to flat panel displays. One or more embodiments of the present invention relate more specifically to a display apparatus capable of controlling light transmittance therethrough.

2. Description of the Related Art

An organic light emitting display apparatus has excellent characteristics in terms of viewing angle, contrast, response speed, and power consumption, and the number of applications to which organic light emitting display apparatuses may be applied has increased. For example, the organic light emitting display apparatus may be applied to personal portable devices such as an MP3 player or a mobile phone, and even to a television (TV). Unlike a liquid crystal display (LCD) device, an organic light emitting display is self-emissive, and thus does not need an additional light source. Therefore, the use of an organic light emitting display reduces the thickness and weight of its display apparatus. In addition, the organic light emitting display apparatus may be formed as a transparent display apparatus, by forming a thin film transistor or an organic light emitting device that is transparent and forming a transmission region (or transmission window) separately from a pixel area.

SUMMARY

One or more embodiments of the present invention include a display apparatus capable of controlling light transmittance.

Additional aspects will be set forth in part in the description which follows and, in part, will be apparent from the description, or may be learned by practice of the presented embodiments.

According to one or more embodiments of the present invention, a display apparatus capable of controlling light transmittance includes: a transparent organic light emitting device including a first region having an emission region capable of emitting light and a second region adjacent to the first region in a horizontal direction and having a transmission region capable of transmitting external light therethrough; and a light transmission control device facing the transparent organic light emitting device, and including a third region formed at a location corresponding to the first region and a fourth region adjacent to the third region in the horizontal direction and positioned to correspond to the second region. The fourth region may include a sealed cavity having a transmission control material layer therein, and the transmission control material layer is configured to be selectively driven by the light transmission control device.

The display apparatus may further include: a first base member including a first surface and an opposite second surface; and a second base member coupled to the first surface of the first base member, wherein the transparent organic light emitting unit is located on the first surface of the first base member and sealed by the second base member.

The first base member may be flexible.

The light transmission control device may be located facing the second surface of the first base member.

The light transmission control device may be located facing a surface of the second base member.

The light transmission control device may include: a third base member; a cavity layer formed on the third base member and including a barrier forming a boundary of a cavity and a roof layer connected to the barrier to form an upper portion of the cavity; a first electrode adjacent to the cavity and located at least in the fourth region; and a second electrode adjacent to the cavity and located at least in the fourth region, the second electrode also being spaced apart from the first electrode.

The third base member may be flexible.

The light transmission control device may further include a light blocking unit located at least in the third region.

The display apparatus may further include a capping layer disposed between the transparent organic light emitting device and the light transmission control device.

The capping layer may include an acryl-based or an epoxy-based polymer material.

The display apparatus may further include: a first polarizer; and a second polarizer facing the first polarizer, wherein the transparent organic light emitting device and the light transmission control device may be located between the first polarizer and the second polarizer.

A direction in which the first polarizer rotates light may be opposite to a direction in which the second polarizer rotates light.

An area of the cavity may be greater than an area of the transmission region.

The transparent organic light emitting device may include: a pixel electrode located in the first region; and an opposite electrode facing the pixel electrode, located in the first region and the second region, and having an opening at a location corresponding to the transmission region, wherein an area of the cavity may be greater than an area of the opening.

The display apparatus may further include an adhesive layer which is disposed between the transparent organic light emitting device and the light transmission control device and which is capable of transmitting light.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
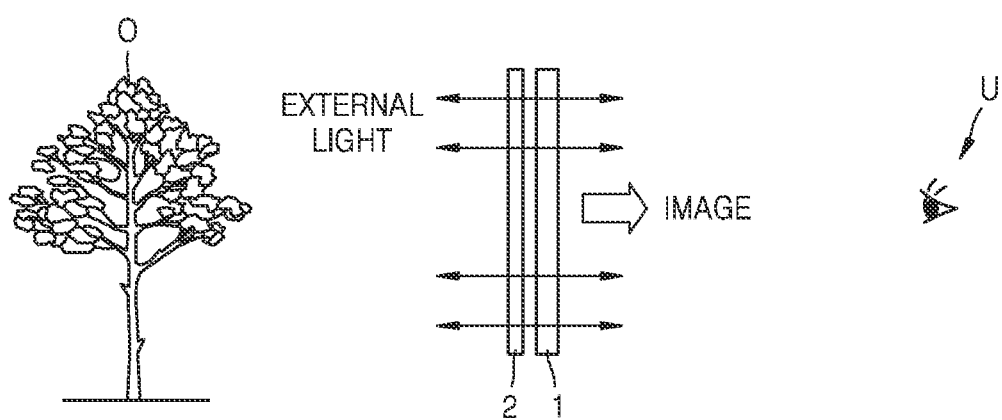
FIGS. 1 and 2 are schematic cross-sectional views of a display apparatus according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. Furthermore, any one or more features of any of the embodiments may be mixed and matched in any manner, to produce further embodiments also falling within the scope of the invention.

Hereinafter, the present invention will be described in detail by explaining preferred embodiments of the invention with reference to the attached drawings. Like reference numerals in the drawings denote like elements, and detailed descriptions may be omitted.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. In other words, since sizes and thicknesses of components in the drawings are arbitrarily illustrated for convenience of explanation, the following embodiments are not limited thereto. Accordingly, the various figures are not necessarily to scale. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of a display apparatus according to an embodiment of the present invention.

Referring to FIG. 1, the display apparatus of the present embodiment includes a transparent organic light emitting device 1 and a light transmission control device 2.

The transparent organic light emitting device 1 emits light of an image toward a user (U), and at the same time, transmits external light in a thickness direction thereof. Thus, an image of an object O, located on the other side of the transparent organic light emitting device 1 from the user U, may be seen through the transparent organic light emitting device 1 by the user U. That is, the user U may simultaneously see both the image generated by device 1, as well as the object O.

The light transmission control device 2 may be disposed between the transparent organic light emitting device 1 and the object O. The light transmission control device 2 may transmit or pass external light in a thickness direction thereof, and accordingly, the image of the object O located behind the transparent organic light emitting device 1 and the light transmission control device 2 may pass through both the transparent organic light emitting device 1 and the light transmission control device 2, to be observed by the user U.

Figure 2:
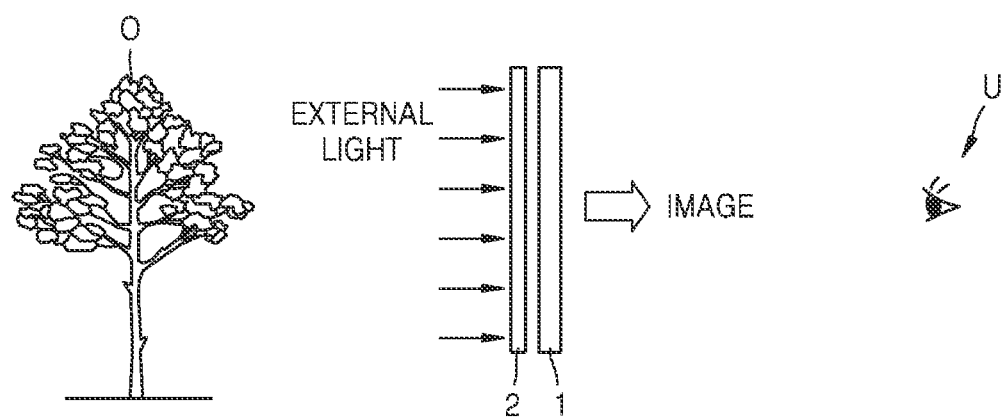

The light transmission control device 2 may be configured so that predetermined regions of device 2 can selectively block transmission of external light. Accordingly, as shown in FIG. 2, the device 2 may selectively block light from object O, so that user U does not observe the image of the object O that is located behind the transparent organic light emitting device 1 and the light transmission control device 2. The user U may freely adjust observation of the image through the transparent organic light emitting device 1 and observation of the object O by using the light transmission control device 2.

In the embodiment shown in FIGS. 1 and 2, the light transmission control device 2 may be closer to the object O than the transparent organic light emitting device 1 is. Accordingly, brightness of the image emitted from the transparent organic light emitting device 1 may not be degraded by the light transmission control device 2, so as to provide the user U with an image of high quality. However, one or more embodiments of the present invention are not limited thereto, and if the emission brightness of the transparent organic light emitting device 1 is sufficiently high, the light transmission control device 2 may be positioned closer to the user U than the object O, i.e. between device 1 and the user U.

According to FIGS. 1 and 2, the transparent organic light emitting device 1 may emit light to a front surface and/or a rear surface of the transparent organic light emitting device 1 to display its image. However, one or more embodiments of the present invention are not limited thereto, that is, as shown in FIGS. 3 and 4, the transparent organic light emitting device 1 may be a dual-emission type device so that a first image may be displayed toward a first user U1 and a second image is displayed toward a second user U2.

Figure 3:
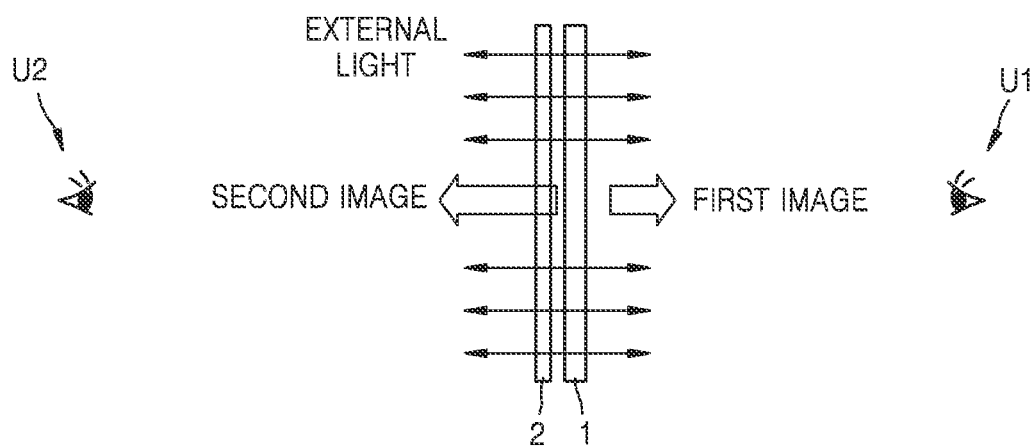
FIGS. 3 and 4 are schematic cross-sectional views of a display apparatus according to another embodiment of the present invention.

As shown in FIG. 3, in a state where the light transmission control device 2 transmits external light, the first user U1 and the second user U2 located on opposite sides of both the transparent organic light emitting device 1 and the light transmission control device 2 may observe the first image and the second image respectively, and moreover, the first user U1 and the second user U2 may also see each other through the transparent organic light emitting device 1 and the light transmission control device 2.

Figure 4:
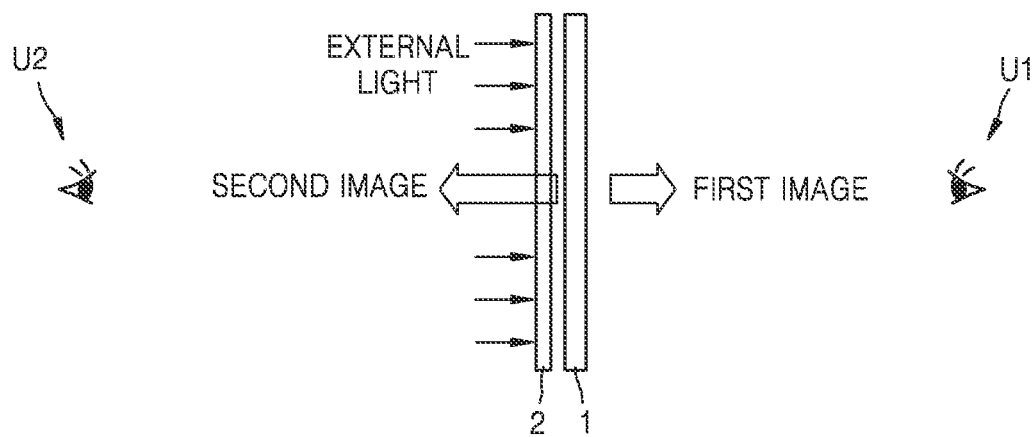

In a state where the light transmission control device 2 selectively blocks the transmission of external light at least at a partial region, as shown in FIG. 4, the first user U1 and the second user U2 may only observe the first image and the second image that are displayed respectively toward the first user U1 and the second user U2, but may not see each other. That is, each user U1, U2 sees only the image emitted by the side of device 1 facing that user; users U1, U2 do not see each other.

As described above, the light transmission control device 2 may act as a shutter unit that may selectively control transmittance of the external light with respect to the transparent organic light emitting device 1.

Figure 5:
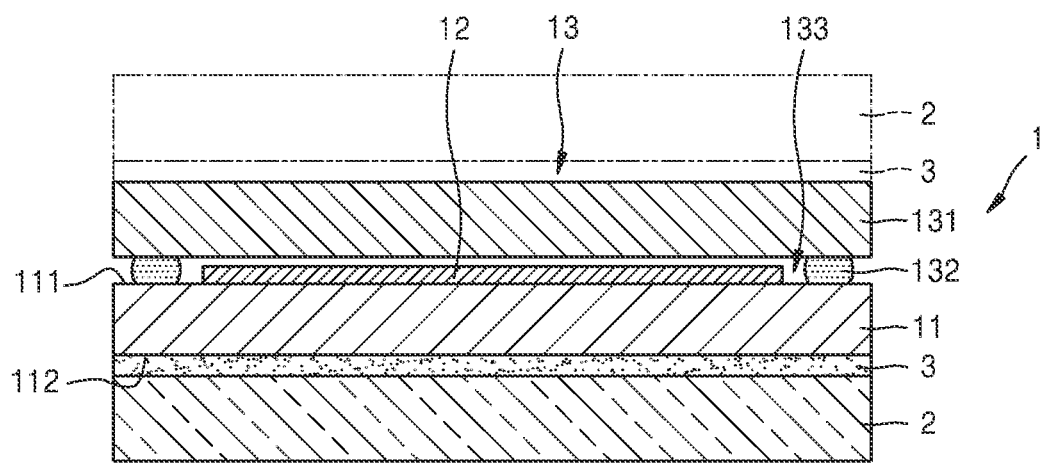
FIG. 5 is a cross-sectional view of a display apparatus according to an embodiment of the present invention.

FIG. 5 is a cross-sectional view of the display apparatus according to the present invention in more detail.

Referring to FIG. 5, the transparent organic light emitting device 1 includes a first base member 11 and a transparent organic light emitting unit 12 disposed on the first base member 11.

The first base member 11 has a first surface 111 and a second surface 112 facing each other, and may be a substrate formed of a glass or a plastic. The first base member 11 may be transparent and flexible.

The transparent organic light emitting unit 12 is formed on the first surface 111 of the first base member 11, and a second base member 13 that is an encapsulation unit is bonded to the first surface 111 of the first base member 11 for sealing the transparent organic light emitting unit 12 from external air and impurities. According to the embodiment of FIG. 5, the second base member 13 may be an encapsulation substrate 131. If the first base member 11 is flexible, the encapsulation substrate 131 may also be flexible. The encapsulation substrate 131 may be formed as a transparent member. The encapsulation substrate 131 may be formed of a glass or a plastic.

Edges of the first base member 11 and the encapsulation substrate 131 are coupled to each other by a sealing material 132 so that a space 133 between the first base member and the encapsulation substrate 131 may be sealed. A moisture absorbent or a filler may be located in the space 133.

Figure 6:
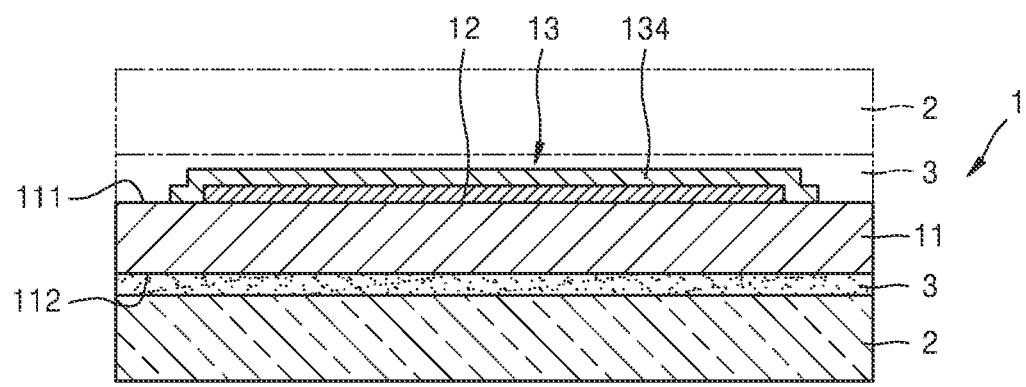
FIG. 6 is a cross-sectional view of a display apparatus according to another embodiment of the present invention.

Instead of the encapsulation substrate 131, as shown in FIG. 6, a thin film encapsulation film 134 may be formed as the second base member 13 and on the transparent organic light emitting unit 12, so as to protect the transparent organic light emitting unit 12 from external air.

The thin film encapsulation film 134 may include a plurality of inorganic layers or a mixture of inorganic and organic layers.

The organic layer of the thin film encapsulation film 134 may be formed of a polymer. For example, the organic layer may have a single-layered structure or a stacked structure including one of polyethylene terephthalate, polyimide, polycarbonate, epoxy, polyethylene, and polyacrylate. In particular, the organic layer may be formed of polyacrylate, and may include a polymerized monomer composition including a diacrylate-based monomer and a triacrylate-based monomer. The monomer composition may further include a monoacrylate-based monomer. Also, the monomer composition may further include a well-known photoinitiator such as 2,4,6-trimethyl benzoyl diphenyl phosphine oxide (TPO); however, one or more embodiments of the present invention are not limited thereto.

The inorganic layer in the thin film encapsulation film 134 may have a single-layered structure or a stacked structure including a metal oxide or a metal nitride. In particular, the inorganic layer may include one of SiNx, $Al_2O_3$, $SiO_2$, and $TiO_2$.

An uppermost layer of the thin film encapsulation film 134 may be formed of an inorganic layer in order to prevent moisture infiltration into the transparent organic light emitting unit.

The thin film encapsulation film 134 may include at least one sandwich structure in which at least one organic layer is inserted between at least two inorganic layers. As another example, the thin film encapsulation film 134 may include at least one sandwich structure in which at least one inorganic layer is inserted between at least two organic layers. As another example, the thin film encapsulation film 134 may include a sandwich structure in which at least one organic layer is inserted between at least two inorganic layers, and a sandwich structure in which at least one inorganic layer is inserted between at least two organic layers.

The thin film encapsulation film 134 may include a first inorganic layer, a first organic layer, and a second inorganic layer sequentially from an upper portion of the transparent organic light emitting unit 12.

As another example, the thin film encapsulation film 134 may include a first inorganic layer, a first organic layer, a second inorganic layer, a second organic layer, and a third inorganic layer sequentially from the upper portion of the transparent organic light emitting unit 12.

As another example, the thin film encapsulation film 134 may include a first inorganic layer, a first organic layer, a second inorganic layer, a second organic layer, a third inorganic layer, a third organic layer, and a fourth inorganic layer from the upper portion of the transparent organic light emitting unit 12.

A metal halide layer including LiF may be further included between the transparent organic light emitting unit 12 and the first inorganic layer. The metal halide layer may prevent damage to the transparent organic light emitting unit 12 when the first inorganic layer is formed by a sputtering method or a plasma deposition method.

The first organic layer may have an area that is less than that of the second inorganic layer, and the second organic layer may have an area that is less than that of the third inorganic layer.

As another example, the first organic layer may be completely covered by the second inorganic layer, and the second organic layer may be completely covered by the third inorganic layer.

In the embodiments of FIGS. 5 and 6, the light transmission control device 2 may be coupled to the second surface 112 of the first base member 11 via an adhesive layer 3. In this case, the transparent organic light emitting unit 12 may be, for example, a top emission type light emitting unit, projecting an image in an upward direction of the drawings (i.e. through the encapsulation substrate 131), or a dual-emission type unit projecting an image in both the upward direction and the downward direction of the drawings. The adhesive layer 3 may transmit light and may, for example, be an OCA film.

The light transmission control device 2 may alternatively be coupled to the upper surface of the second base member 13 via the adhesive layer 3. In this case, the transparent organic light emitting unit 12 may be a bottom emission type projecting an image in the downward direction of the drawings, or a dual emission type projecting images in both the upward and downward directions of the drawings.

Figure 7:
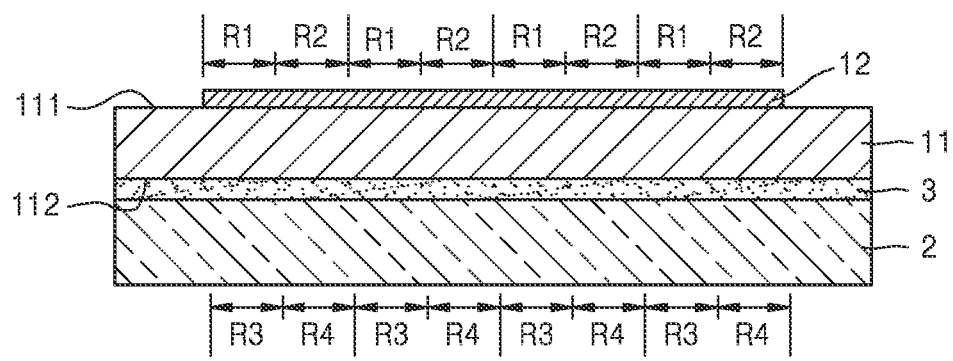
FIG. 7 is a cross-sectional view of a transparent organic light emitting unit and a light transmittance controlling device according to an embodiment of the present invention.

As shown in FIG. 7, the transparent organic light emitting unit 12 may include first regions R1 including emission regions that emit light, and second regions R2 including transmission regions through which external light passes. The first and second regions R1 and R2 may be adjacent to each other in a horizontal direction. Since the light is emitted from the emission regions, the user may see the image displayed on the transparent organic light emitting unit 12. Since external light passes through the transmission regions, the user may observe the transmitted image of an object located across the display apparatus. Therefore, the first substrate 11 may be transparent. In FIG. 7, the first and second regions R1, R2 of the transparent organic light emitting unit 12 are immediately adjacent to each other, and uniformly formed throughout the entire horizontal area of the transparent organic light emitting unit 12. However, one or more embodiments of the present invention are not limited thereto. That is, the first and second regions R1 and R2 may be separated from each other. This will be applied to one or more embodiments of the present invention, as described below.

The light transmission control device 2 may include third regions R3 and fourth regions R4 that are adjacent to each other in the horizontal direction. The third regions R3 correspond to the locations of the first regions R1, and the fourth regions R4 correspond to the locations of the second regions R2. In FIG. 7, the third and fourth regions R3, R4 of the light transmission control device 2 are immediately adjacent to each other and uniformly formed throughout the entire horizontal area of the light transmission control device 2; however, one or more embodiments of the present invention are not limited thereto. That is, the third and fourth regions R3 and R4 may be separated from each other, and this may be applied to one or more embodiments of the present invention, as described below.

Figure 8:
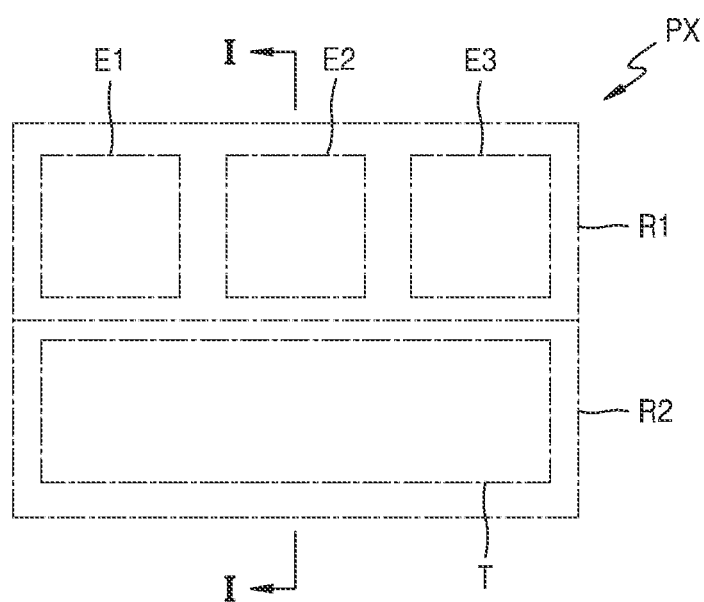
FIG. 8 is a plan view of a pixel in the transparent organic light emitting unit.
Figure 9:
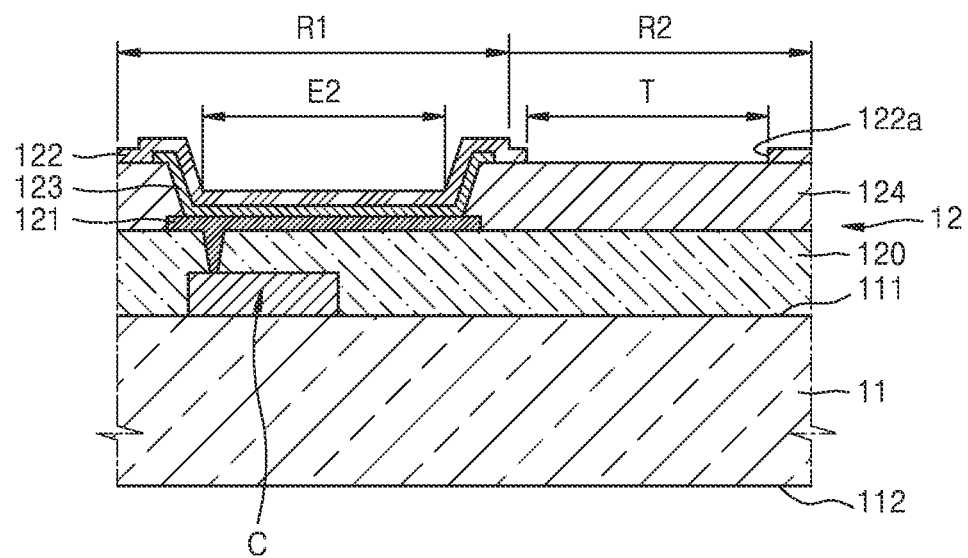
FIG. 9 is a cross-sectional view of the pixel taken along line I-I of FIG. 8.

The transparent organic light emitting unit 12 may include a plurality of pixels. FIG. 8 is a plan view of one pixel PX from among the plurality of pixels, and FIG. 9 is a cross-sectional view of the pixel taken along line I-I of FIG. 8.

The pixel PX may include the first region R1 and the second region R2. The first region R1 may include a first emission region E1, a second emission region E2, and a third emission region E3 that each emit light, and the second region R2 may include a transmission region T through which the external light passes. The first, second, and third emission regions E1, E2 and E3 may be, for example, a red sub-pixel, a green sub-pixel, and a blue sub-pixel, respectively. FIG. 8 shows that one pixel PX includes three emission regions. However, one or more embodiments of the present invention are not limited thereto, and the pixel PX may further include any number of sub-pixels each being of any color.

For example, red, green, blue, and/or white sub-pixels may make up one pixel PX that emits white light. In this case, a color converting layer or a color filter for changing the white light emitted from each pixel into a predetermined color may be adopted.

The red, green, blue, and/or white sub-pixels are but an illustrative example, and the present embodiment is not limited thereto. That is, combinations of pixels emitting light of various colors, in addition to the combination of red, green, blue, and/or white, may be used.

Referring to FIG. 9, an organic light emitting device and a pixel circuit unit C may be disposed in the first region R1. The pixel circuit unit C may include a switching thin film transistor (TFT) connected to a scan line and a data line, a driving TFT connected to the switching TFT and a Vdd line, and a capacitor connected to the switching TFT and the driving TFT. These circuit elements and their construction are known.

A first insulating layer 120 may be formed to cover the pixel circuit unit C. The first insulating layer 120 may have a single-layered structure or a multi-layered structure, an upper surface of which is planarized. The first insulating layer 120 may be formed of an inorganic material and/or an organic material.

As shown in FIG. 9, a pixel electrode 121 that is electrically connected to the pixel circuit unit C may be formed on the first insulating layer 120. The pixel electrode 121 may be formed as an island, and a plurality of pixel electrodes 121 are spaced apart from each other.

A second insulating layer 124 is formed on the first insulating layer 120 so as to cover edges of the pixel electrodes 121. The second insulating layer 124 may be formed of an organic material such as acryl and polyimide.

An intermediate layer 123 including an organic emission layer is formed on the pixel electrode 121, and an opposite electrode 122 is formed to cover the intermediate layer 123 to form the organic light emitting device.

The intermediate layer 123 may be formed of a low-molecular weight or a high-molecular weight organic layer.

The intermediate layer 123 may include a first intermediate layer, a second intermediate layer, and the organic emission layer between the first and second intermediate layers.

The first intermediate layer is disposed between the organic emission layer and the pixel electrode 121, and may include a hole injection layer (HIL) and/or a hole transport layer (HTL).

The second intermediate layer is disposed between the organic emission layer and the opposite electrode 122, and may include an electron transport layer (ETL) and/or an electron injection layer (EIL).

The organic emission layer may be independently formed in each of the red, green, and blue sub-pixels, and the first and second intermediate layers may be formed commonly throughout the pixels.

The HIL may include a phthalocyanine compound such as copper phthalocyanine, or TCTA, and m-MTDATA or m-MTDAPB that is star-burst type amine.

The HTL may be formed of N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD).

The ETL may be formed of $Alq_3$.

The EIL may be formed of a material such as LiF, NaCl, CsF, $Li_2O$, BaO, or Liq.

The organic emission layer may include a host material and a dopant material.

The host material of the organic emission layer may be tris(8-hydroxyquinolinato)aluminum ($Alq_3$), 9,10-di(naphty-2-yl)anthracene (AND), 2-tert-butyl-9,10-di(naphthy-2-yl)-anthracene (TBADN), 4,4'-Bis(2,2-diphenyl-ethen-1-yl)biphenyl (DPVBi), or 4,4'-Bis[2,2-di(4-methylphenyl)-ethen-1-yl]biphenyl (p-DMDPVBi).

The dopant material of the organic emission layer may be 4,4'-bis[4-(di-p-tolylamino)styryl]biphenyl (DPAVBi), 9,10-di-(2-naphthyl)anthracene (ADN), or 2-tert-butyl-9,10-di(naphth-2-yl)anthracene (TBADN).

The above listed materials for the intermediate layer 123 are exemplary only, and the invention contemplates these and any other suitable materials for forming a light emitting layer.

The pixel electrode 121 may function as an anode and the opposite electrode 122 may function as a cathode, or vice versa.

If the pixel electrode 121 functions as an anode, the pixel electrode 121 may include indium tin oxide (ITO), indium zinc oxide (IZO), ZnO, or $In_2O_3$ having a large work function. In a case of the top emission type display in which the image is displayed toward the second base member 13, the pixel electrode 121 may further include a reflective layer (not shown) including at least one selected from Ag, Mg, Al, Pt, Pd, Au, Ni, Nd, Ir, Cr, Li, Yb, Co, Sm, and Ca.

If the opposite electrode 122 functions as a cathode, the opposite electrode 122 may be formed of a metal such as Ag, Mg, Al, Pt, Pd, Au, Ni, Nd, Ir, Cr, Li, Yb, Co, Sm, or Ca. In a case of the top emission type display in which the image is displayed toward the second base member 13, the opposite electrode 122 may transmit light emitted from the intermediate layer 123 so that the image may be displayed. To do this, the opposite electrode 122 may be formed as a thin film by using Mg and/or Mg alloy. The opposite electrode 122 may be formed as a thin film by using Ag and/or Ag alloy having higher light transmittance than that of Mg and/or Mg alloy. The opposite electrode 122 may be formed by commonly depositing or stacking the Mg and/or Mg alloy and Ag and/or Ag alloy. In addition, the opposite electrode 122 may be formed as a thin film by using metal including at least one selected from Al, Pt, Pd, Au, Ni, Nd, Ir, Cr, Li, Yb, Co, Sm, and Ca. In a case of the bottom emission type display, the opposite electrode 122 may be thick so as to reflect light.

The opposite electrode 122 may be formed as a common electrode so as to apply a common voltage across all the pixels, unlike the pixel electrode 121. This may be accomplished by using an open mask, so that the opposite electrode 122 is not patterned in each of the pixels. Therefore, the opposite electrode 122 may be located on both the first and second regions R1 and R2.

The first region R1 includes a second emission region E2 and the second region R2 includes the transmission region T. The second emission region E2 emits light generated by the stacked pixel electrode 121, intermediate layer 123, and opposite electrode 122. An image of an object disposed under the substrate 11 passes through the transmission region T so that the user may observe the passed image through the second base member 13.

Selectively, an opening 122a may be formed in the opposite electrode 122 that is formed of metal having high reflectivity. Opening 122a thus forms a transmission window in order to increase an external light transmittance through the transmission region T. The opening 122a may have a shape corresponding to the transmission region T. As shown in FIG. 8, if one transmission region T is formed as wide as its three sub-pixels, that is, the first, second, and third emission regions E1, E2, and E3, in a transverse direction, that is, a width direction thereof, the opening 122a formed in the second electrode 122 may be formed to be adjacent to the three sub-pixels, that is, the first, second, and third emission regions E1, E2, and E3 so as to correspond to the shape of the transmission region T. FIG. 9 shows that the opening 122a, that is, the transmission window, is only formed in the second electrode 122; however, one or more embodiments of the present invention are not limited thereto, that is, an opening connected to the opening 122a may be further formed in at least one of the first insulating layer 120 and the second insulating layer 124. Accordingly, the external light transmittance in the transmission region T may be increased. The opening 122a may have an area that is at least approximately the same as that of the transmission region T. However, one or more embodiments of the present invention are not limited thereto, that is, the opening 122a may have an area that is less than or greater than that of the transmission region T.

In addition, the opening 122a may not be formed continuously across the first, second, and third emission regions E1, E2, and E2, but may instead be formed as three separate openings corresponding respectively to the first, second, and third emission regions E1, E2, and E3.

The pixel structure of the transparent organic light emitting unit shown in FIGS. 8 and 9 may be applied to the other embodiments of the present invention.

According to the pixel structure of FIG. 9, when the pixel circuit unit C overlaps with (i.e. falls within) the second emission region E2 and the display is a top emission type display, areas of the first, second, and third emission regions E1, E2, and E3 may be made large.

Figure 10:
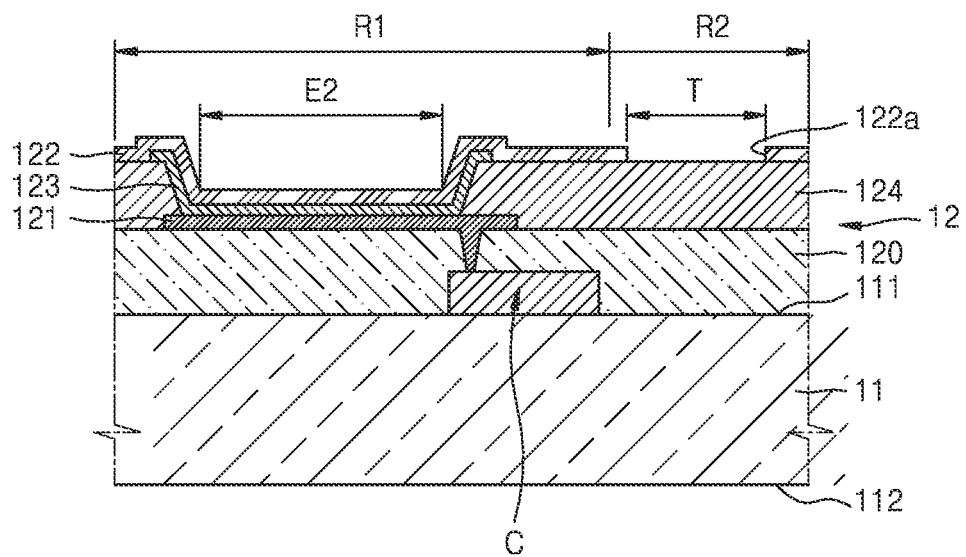
FIG. 10 is a cross-sectional view of the pixel taken along line I-I of FIG. 8 according to another example.

FIG. 10 is a cross-sectional view of a pixel structure according to another embodiment of the present invention.

Referring to FIG. 10, the pixel structure does not overlap with the second emission region E2. Accordingly, when the display is a bottom emission type and/or a dual-emission type display, the image displayed toward the first base member 11 may not be blocked by the pixel circuit unit C. Other components are the same as those of the embodiment shown in FIG. 9, and thus, detailed descriptions thereof are omitted here.

Figure 11:
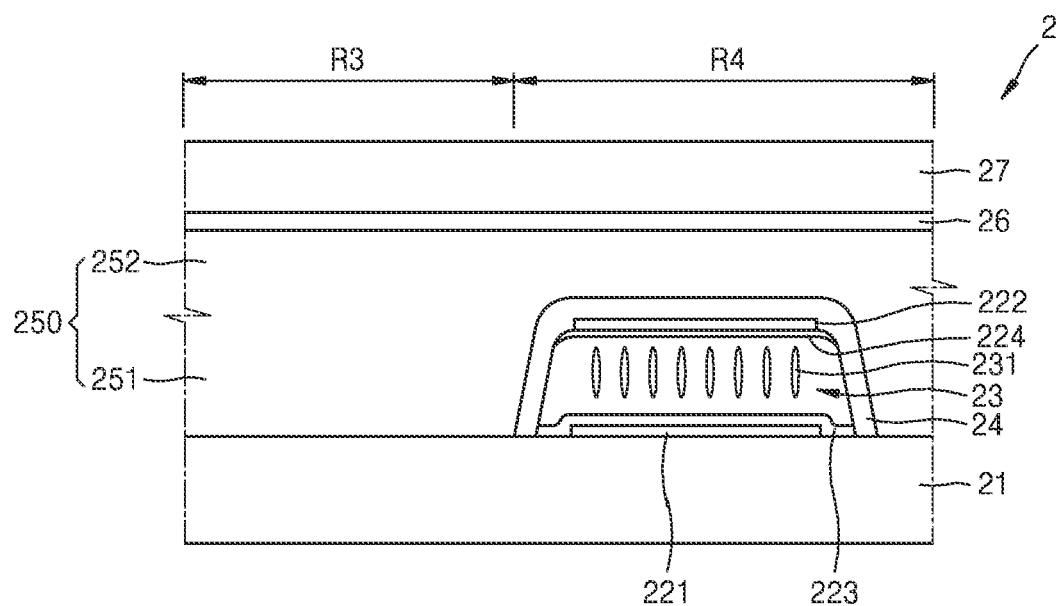
FIG. 11 is a cross-sectional view of a light transmission control device according to an embodiment of the present invention.

FIG. 11 is a cross-sectional view of the light transmittance controlling device of FIG. 7 in more detail.

As described above, the light transmission control device 2 includes the third region R3 and the fourth region R4 that are adjacent to each other in the horizontal direction.

Here, the fourth region R4 may include a cavity 23 that is sealed, and a transmission control material layer 231 located in the cavity 23. In this manner, the light transmission control device 2 may selectively drive the transmission control material layer 231 so as to selectively block light transmission through the fourth region R4.

The light transmission control device 2 may include a third base member 21, a cavity layer 250 formed on the third base member 21 to form the cavity 23, and a first electrode 221 and a second electrode 222 that are adjacent or proximate to the cavity layer 250 and located at least in the fourth region R4 to be separate from each other. The cavity layer 250 may include a barrier 251 forming a boundary of the cavity 23, and a roof layer 252 connected to the barrier 251 to form an upper portion of the cavity 23. The transmission control material layer 231 accommodated in the cavity 23 may be a liquid crystal material layer, an electrophoretic material layer, or an organic light emitting material layer.

Such above structure is an embedded micro cavity structure, and has characteristics such as reduction in manufacturing costs and light weight when compared with conventional structures, that is, structures in which a liquid crystal layer is formed between two substrates on which electrodes are formed. Also, when the above structure is used as a flexible shutter, image degradation due to bending may be prevented.

The first electrode 221 is formed on the third base member 21. The third base member 21 may be a transparent glass substrate or a transparent plastic substrate, and may be flexible. If the first base member 11 and the second base member 13 are flexible, an assembly of the transparent organic light emitting device 1 and the light transmission control device 2 may also be flexible.

The first electrode 221 may be formed of a transparent conductive material, for example, ITO, IZO, ZnO, or $In_2O_3$. The first electrode 221 may be formed as a stripe so as to penetrate through, or conform to the shape of, the fourth region R4.

The first electrode 221 may include a plurality of branch electrodes, and a stem electrode connecting the branch electrodes may be further formed on a region that is not shown in the drawings.

A sacrificial layer (not shown) is formed on the third base member 21. Since the sacrificial layer is removed in a post process to form the cavity 23, the sacrificial layer may be patterned to correspond to the shape of the cavity 23. The sacrificial layer may be formed of a photoresist material.

The second electrode 222 is formed on the sacrificial layer. The second electrode 222 may be formed of a transparent conductive material, for example, ITO, IZO, ZnO, and $In_2O_3$. The second electrode 222 may be formed as a stripe so as to penetrate through, and conform to the shape of, the fourth region R4, and also to be spaced apart from the first electrode 221. The first and second electrodes 221 and 222 are formed as stripes crossing each other to configure a passive matrix (PM) type light modulator.

A passivation layer 24 is formed on the second electrode 222. Since the passivation layer 24 is formed to cover the sacrificial layer, the passivation layer 24 may surround the cavity 23. The passivation layer 24 may be formed of an insulating layer having a high light transmittance, for example, SiNx, $Al_2O_3$, SiOx, and TiOx.

The cavity layer 250 may be formed on the third base member layer 21 so as to cover the passivation layer 24. Therefore, the cavity layer 250 may include the barrier 251 forming the boundary of the cavity 23, and the roof layer 252 connected to the barrier 251 to form the upper portion of the cavity 23. The cavity layer 250 may be formed of a polymer such as polyethylene terephthalate, polyimide, polycarbonate, epoxy, polyethylene, and polyacrylate.

A thickness of the cavity layer 250 on an upper portion of the sacrificial layer, that is, a thickness of the roof layer 252, may be set as 50 μm or less. If the roof layer 252 is excessively thick, exposure energy or time taken to perform the exposure may increase in an electric field/non-electric field light exposure process that will be described later.

After forming the cavity layer 250, a patter mask layer 26 may be formed on the cavity layer 25. The pattern mask layer 26 may be formed of SiNx, and may be patterned in order to transform a predetermined region in the cavity layer 250 for exposing a part of the sacrificial layer.

A predetermined region of the cavity layer 250 is removed by using the pattern mask layer 26 so as to expose some parts of the passivation layer 24 and the sacrificial layer, and then the sacrificial layer may be removed by using, for example, a wet strip process so as to form the cavity 23 at the removed part of the sacrificial layer. An oxygen plasma process may be further performed in order to remove residues. After that, a transmission control material, for example, a liquid crystal material, is injected into the cavity 23 and sealed to form the transmission control material layer 231.

For example, an inkjet nozzle may be used to inject the liquid crystal material. In addition, before injecting the liquid crystal material into the cavity 23, as shown in FIG. 11, a first alignment layer 223 and a second alignment layer 224 may be formed on lower and upper portions of the cavity 23. The first and second alignment layers 223 and 224 may be formed of polyimide, and may undergo a thermal curing process. The first and second alignment layers 223 and 224 may be isolated, i.e. spaced apart, from each other; however, the first and second alignment layers 223 and 224 may alternatively be connected to each other along an inner wall of the cavity 23 according to the manufacturing processes desired.

After injecting the liquid crystal material, an open region of the cavity layer 25 may be filled with a material that is the same as or similar to the material forming the cavity layer 250.

Next, an electric field light exposure and/or a non-electric field light exposure process is performed.

The electric field light exposure process is a process of irradiating light while forming an electric field in the transmission control material layer 231, e.g., the liquid crystal material layer. In contrast, the non-electric field light exposure process is a process of irradiating light without forming an electric field in the transmission control material layer 231.

In an electric field light exposure process, electric field light exposure is performed to form a pre-tilt in the liquid crystal material. In the electric field light exposure process, when a voltage is applied between the first electrode 221 and the second electrode 222 and an electric field is formed in the liquid crystal material, liquid crystal molecules in the liquid crystal material are aligned in a predetermined direction. More specifically, adjacent liquid crystal molecules are aligned in parallel with a length direction of a plurality of branch electrodes 141 forming the first electrode 221, and major axes thereof are inclined at a predetermined angle. In FIG. 11, the major axes of the liquid crystal molecules are shown as being arranged perpendicular to the surface of third base member 21 for convenience of description. However, the major axes may be actually tilted with respect to the substrate. During electric field light exposure, a liquid crystal compound including liquid crystal molecules is hardened, and orientation of the liquid crystal molecules is maintained after removing the electric field.

The non-electric field light exposure process induces reaction of the remaining liquid crystal compound that fails to react during the electric field light exposure process, and thus makes alignment of the liquid crystal molecules more uniform.

The electric field/non-electric field light exposure processes are performed with an exposure energy and exposure time appropriate for liquid crystal alignment. In the present embodiment, the cavity layer 250 may be formed thin, and thus energy and time for the light exposure processes may be reduced.

A capping layer 27 may be formed on the pattern mask layer 26. Before forming the capping layer 27, a cleaning process may be performed in order to remove residual liquid crystal generated through the liquid crystal injection process. The capping layer 27 may also be formed on the cavity layer 250 without the pattern mask layer 26 disposed therebetween.

The capping layer 27 is formed to entirely cover the cavity layer 250 that forms the cavity 23 in which the liquid crystal material is accommodated so as to encapsulate and protect the cavity 23.

The capping layer 27 may include an acryl-based or an epoxy-based polymer material.

According to the embodiment of the present invention, the capping layer 27 may be formed of a sealant material in which a plurality of fillers are distributed. One example of such material would be a polymer-filled nanocomposite (PFN). The capping layer 27 is formed to improve barrier characteristics by using the sealant material, and accordingly, a thermal expansion coefficient is reduced, and static electricity may be reduced.

When filler particles in the polymer form a matrix, a volume fraction of the filler, an aspect ratio of the filler, and penetrating property are in following relation.

$$\frac{P_{comp}}{P_{poly}} = \frac{1-\phi}{1+a\phi}$$

Here, $P_{comp}$ denotes the penetrating property of the PFN, and $P_{poly}$ denotes the penetrating property of the pure polymer. Also, a denotes an aspect ratio, $\phi$ denotes a volume fraction of the filler with respect to the polymer, and it is assumed that the filler is distributed homogeneously in the polymer.

According to the above equation, the barrier characteristic may be improved only by containing a very small amount of filler. For example, in a case of PFN containing about 1% filler, the penetrating property is greatly reduced when compared with a polymer that does not contain filler. This tendency becomes greater when the aspect ratio of the filler increases.

The penetrating property of the PFN is also affected by the orientation of the filler within the polymer, and may be represented by following equation.

$$\frac{P_{comp}}{P_{poly}} = \frac{1-\phi}{1+a\phi\frac{2}{3}\left(S+\frac{1}{2}\right)}$$

Here, S may be defined by following equation.

$$S = \frac{1}{2}\langle 3\cos^2\theta - 1\rangle$$

Here, θ denotes an angle of the filler with respect to a reference surface. If the filler is disposed in parallel with the reference surface, a value of θ is 0, and thus S becomes 1. If the filler is disposed perpendicular to the reference surface, the value of θ is 90°, and thus, S becomes −1/2. If the filler is disposed randomly, S becomes 0.

In this case, when the aspect ratio of the filler increases, the influence of the orientation of the filler on the penetrating property is reduced.

In the one or more embodiments, the sealant, the filler type, the volume fraction, and the filler material in the PFN that is used to form the capping layer 27 may be set in consideration of the above results and the light transmittance of the capping layer 27.

Various polymers that are generally used as a sealing material, for example an acryl-based or epoxy-based polymer, may be used as the sealant. For example, an acryl-based or epoxy-based polymer material including a photoinitiator may be used as the sealant. Viscosity may range from 30 to 10000 CP.

The filler may include nanoparticles, nanowires, or nanorods having nano-size, and the material forming the filler may include Ta, Nb, Zr, Th, Ti, Al, Mg, Ba, or P. The material forming the filler may be a getter material capable of absorbing gas, for example, $O_2$. The aspect ratio of the filler may be 50 or greater, for example, 300 or greater.

A volume fraction of the filler contained in the sealant may be 0.5% or greater. For example, the volume fraction of the filler may be 1% or greater. When the volume fraction of the filler increases, the light transmittance of the capping layer 27 degrades, and accordingly, the volume fraction of the filler may be set to be 5% or less.

The capping layer 27 may be formed by coating or printing a liquid phase sealant, in which a plurality of fillers are distributed, on the pattern mask layer 26.

The capping layer 27 may have the penetrating property that is greatly reduced and may also have improved barrier characteristics as a result of the filler, an amount of which is too small to affect the light transmittance. In addition, since the capping layer 27 is formed after the electric field/non-electric field light exposure processes for forming the pre-tilt of the liquid crystal material layer, there is effectively no possibility that the filler infiltrates into the cavity 23 or affects the pre-tilt process.

The transmission of external light through the transmission region T may be selectively blocked by the transmission control material layer 231 filled in the cavity 23. An area of the cavity 23 may be greater than that of the transmission region T in the first region R1. Accordingly, in an external light blocking mode, the transmission of external light through the transmission region T may be prevented by the transmission control material layer 231 filled in the cavity 23 of the light transmission control device 2.

The area of the cavity 23 may be greater than that of the opening 122a formed in the opposite electrode 122. That is, cavity 23 may be formed to be wider than opening 122a. Accordingly, in the external light blocking mode, transmission of the external light through the transmission region T, in particular, the opening 122a, may be prevented by the transmission control material layer 231 of the cavity 23.

Figure 12:
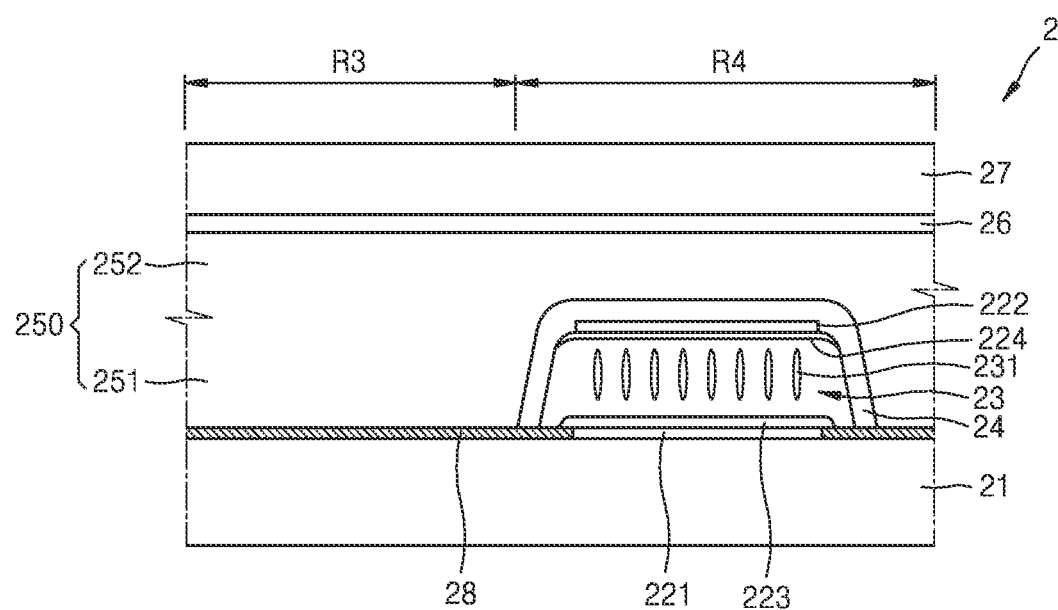
FIG. 12 is a schematic cross-sectional view of a light transmission control device according to another embodiment of the present invention.

FIG. 12 is a cross-sectional view of the light transmission control device of FIG. 7 in more detail.

According to the embodiment shown in FIG. 12, a light blocking unit 28 may be further formed in the third region R3, unlike the embodiment of FIG. 11. The light blocking unit 28 may be a black matrix.

Since the third region R3 is located to correspond to the first region R1 of the transparent organic light emitting device 1, visibility may be improved when the emission region of the first region R1 emits light.

In addition, the capping layer 27 may be formed integrally with the adhesive layer 3 so that the transparent organic light emitting device 1 and the light transmission control device 2 may be attached to each other without using an additional adhesive layer.

Figure 13:
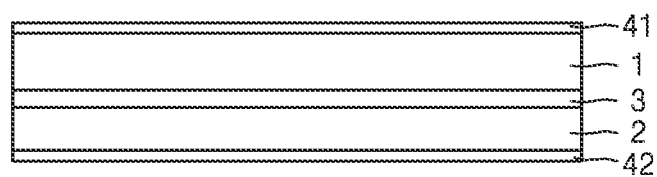
FIG. 13 is a schematic cross-sectional view of a display apparatus according to another embodiment of the present invention.

FIG. 13 is a cross-sectional view of a display apparatus according to another embodiment of the present invention.

The display apparatus includes a first polarizer 41 and a second polarizer 42 facing the first polarizer 41. The transparent organic light emitting device 1 and the light transmission control device 2 may be located between the first and second polarizers 41 and 42. According to the present embodiment, the first polarizer 41 may be formed on an outer surface of the transparent organic light emitting device 1, and the second polarizer 42 may be formed on an outer surface of the light transmission control device 2.

A rotation direction of the external light due to the first polarizer 41 and a rotation direction of light due to the second polarizer 42 may be opposite to each other. According to the present embodiment, the first polarizer 41 may use a circular polarizing film that may prevent the external light from being reflected by the surface of the transparent organic light emitting device 1. The second polarizer 42 may use a circular polarizing film, the rotating direction of which is opposite to that of the circular polarizing film of the first polarizer 41. Accordingly, when the liquid crystal material layer is used as the transmission control material layer, the transmission control material layer may be driven by the first and second polarizers 41 and 42.

According to the above embodiment, only two polarizers are used in the assembly of the transparent organic light emitting device 1 and the light transmission control device 2 in order to reduce the reflection of the external light by the surface of the organic light emitting device 1 and to drive the transmission control material layer. Accordingly, a thickness of the entire display apparatus may be reduced, and the reduction in the external light transmittance due to the increase in the number of the polarizers may be prevented.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A display apparatus capable of controlling light transmittance, the display apparatus comprising:
    a transparent organic light emitting device comprising:
        a first region including an emission region capable of emitting light; and
        a second region adjacent to the first region in a horizontal direction, the second region including a transmission region capable of transmitting external light therethrough; and
    a light transmission control device facing the transparent organic light emitting device, the light transmission control device comprising:
        a third region formed at a location corresponding to the first region; and
        a fourth region adjacent to the third region in the horizontal direction and positioned to correspond to the second region,
    wherein the fourth region comprises a sealed cavity having a transmission control material layer therein, and the transmission control material layer is configured to be selectively driven by the light transmission control device.

2. The display apparatus of claim 1, further comprising:
    a first base member comprising a first surface and an opposite second surface; and
    a second base member coupled to the first surface of the first base member,
    wherein the transparent organic light emitting unit is located on the first surface of the first base member and sealed by the second base member.

3. The display apparatus of claim 2, wherein the first base member is flexible.

4. The display apparatus of claim 2, wherein the light transmission control device is located facing the second surface of the first base member.

5. The display apparatus of claim 2, wherein the light transmission control device is located facing a surface of the second base member.

6. The display apparatus of claim 2, wherein the light transmission control device comprises:
    a third base member;
    a cavity layer formed on the third base member, the cavity layer comprising a barrier forming a boundary of a cavity and a roof layer connected to the barrier to form an upper portion of the cavity;
    a first electrode adjacent to the cavity and located at least in the fourth region; and
    a second electrode adjacent to the cavity, the second electrode located at least in the fourth region, and spaced apart from the first electrode.

7. The display apparatus of claim 6, wherein the third base member is flexible.

8. The display apparatus of claim 6, wherein the light transmission control device further includes a light blocking unit located at least in the third region.

9. The display apparatus of claim 6, further comprising a capping layer disposed between the transparent organic light emitting device and the light transmission control device.

10. The display apparatus of claim 9, wherein the capping layer comprises an acryl-based or an epoxy-based polymer material.

11. The display apparatus of claim 1, further comprising:
    a first polarizer; and
    a second polarizer facing the first polarizer,
    wherein the transparent organic light emitting device and the light transmission control device are located between the first polarizer and the second polarizer.

12. The display apparatus of claim 11, wherein a direction in which the first polarizer rotates light is opposite to a direction in which the second polarizer rotates light.

13. The display apparatus of claim 1, wherein an area of the cavity is greater than an area of the transmission region.

14. The display apparatus of claim 1, wherein the transparent organic light emitting device comprises:
    a pixel electrode located in the first region; and
    an opposite electrode facing the pixel electrode, located in the first region and the second region, and having an opening at a location corresponding to the transmission region,
    wherein an area of the cavity is greater than an area of the opening.

15. The display apparatus of claim 1, further comprising an adhesive layer which is disposed between the transparent organic light emitting device and the light transmission control device and which is capable of transmitting light.

* * * * *